United States Patent [19]

Kemmer et al.

[11] Patent Number: 4,896,201
[45] Date of Patent: Jan. 23, 1990

[54] SEMICONDUCTOR DETECTOR HAVING INTEGRATED COUPLING CAPACITORS AND INTEGRATED DC BIASING STRUCTURES

[75] Inventors: Josef Kemmer, Haimhausen; Gerhard Lutz, c/o Max Planck Institut für Physik und Astrophysik Föhringer Ring 6, 8000 Munich 80; Peter Holl, c/o MBB GmbH, P.O. Box 80 11 09, 8000 Munich 80; Lothar Strueder, c/o MPT fur Physik und Astrophysik Föhringer Ring 6, 8000 Munich 40, all of Fed. Rep. of Germany

[73] Assignees: Messerschmitt-Boelkow-Blohm GmbH; Gerhard Lutz, both of Munich; Peter Holl, Grafing; Lothar Strueder, Munich, all of Fed. Rep. of Germany

[21] Appl. No.: 189,619

[22] Filed: May 3, 1988

[30] Foreign Application Priority Data

May 11, 1987 [DE] Fed. Rep. of Germany ....... 3715674

[51] Int. Cl.$^4$ ............................................. H01L 27/14
[52] U.S. Cl. ........................................ 357/30; 357/47; 357/48; 357/51

[58] Field of Search .................... 357/30, 30 F, 30 C, 357/30 D, 30 H, 30 P, 30 E, 30 Q, 30 R, 51, 47, 48

[56] References Cited

U.S. PATENT DOCUMENTS 4,028,719  6/1977  Curtis .................................... 357/30
4,496,964  1/1985  Isubouchi et al. .................... 357/30

Primary Examiner—William L. Sikes
Assistant Examiner—Georgia Y. Epps
Attorney, Agent, or Firm—W. G. Fasse; D. H. Kane, Jr.

[57] ABSTRACT

A semiconductor radiation detector has an at least partially or even completely depleted base region of a first conductivity, to which a bias voltage is applied, and has at least one output or read-out electrode at which a signal is produced by the charge carriers generated by radiation incident on the detector. The read-out or output electrode includes a highly doped region of the first or a second conductivity, onto which an insulating layer and thereupon a conducting electrode layer are applied for outputting the generated or induced signals. The voltage application to the highly doped region of the read-out or output electrode is achieved through a high impedance through the base region of the detector, from at least one electrode of the same conductivity as that of the output or read-out electrode. Thus, it is simply possible to capacitively couple the detector to external circuitry even if these external circuits have a complex structure or arrangement.

13 Claims, 6 Drawing Sheets

SEMICONDUCTOR DETECTOR HAVING INTEGRATED COUPLING CAPACITORS AND INTEGRATED DC BIASING STRUCTURES

FIELD OF THE INVENTION

This invention relates to a semiconductor detector having a capacitive charge carrier read out and integrated DC biasing structures for detecting incident radiation. Such a detector has a partially or completely depleted base region of a first conductivity to which a bias voltage is applied, and it has at least one read-out or output electrode at which a signal is produced by the charge carriers generated by radiation incident on the detector.

DESCRIPTION OF THE PRIOR ART

In semiconductor detectors of this type, which are generally known in the prior art, it is possible to select or read out majority charge carriers as well as minority charge carriers to produce an output signal. Of special interest are the strip detectors in which a plurality of strip electrodes are arranged in parallel to each other, but electrically insulated from one another. A position detection or measurement is possible by means of such strip detectors.

In general, the signal from the detector is transmited directly or through external capacitances to further electronic circuitry. Capacitive coupling has the advantage, that the external electronic circuitry can be isolated from undesirable dark currents of the detector. However, the capacitive coupling of integrated electronic read-out means having a high read-out density is quite difficult, if not impossible, for known semiconductor detectors of this type, since the large coupling capacitances and high-value resistances which are necessary to achieve such coupling cannot be integrated into the electronics at a reasonable cost and effort.

OBJECTS OF THE INVENTION

In view of the foregoing it is the aim of the invention to achieve the following objects singly or in combination:

to construct and improve a semiconductor detector of the above described general type which may be effectively capacitively coupled to even complex electronic circuits;

to integrate the necessary coupling capacitance into such a semiconductor detector in order to effectively isolate the dark current of the detector;

to provide means for DC biasing integrated into such a semiconductor detector;

to avoid the need in such a semiconductor detector of providing auxiliary high-value resistances which are technologically difficult to produce;

to allow operation at lower voltages and thereby produce lower electric fields in such a semiconductor detector; and to achieve a position detection, even of two independent coordinates, by means of such a semiconductor detector having strip type electrodes.

SUMMARY OF THE INVENTION

These objects have been achieved according to the invention in a semiconductor device of the above described type, wherein the output or read-out electrode comprises a highly doped region of the first or second conductivity type, onto which an insulating layer and thereupon a conducting electrode layer are applied. The signals produced by the detector may be read-out at this electrode layer. The voltage supply to the highly doped region of the output or read-out electrode is achieved with a high impedance through the base region of the detector by at least one electrode of the same conductivity as the output or read-out electrode.

In example embodiments the output electrode or electrodes is/are partially or completely surrounded by or inbedded in regions of a different conductivity in order to electrically separate the electrodes. Alternatively, the electrodes are partially or completely surrounded by appropriately biased MOS structures for electrically separating the electrodes. The oxide charge may be compensated by large area surface doping, for example by ion implantation, in order to electrically isolate the electrodes from one another. The regions of different conductivity, as well as the MOS structures, may be segmented so that the separate regions or segments can attain different voltages. Several output electrodes and regions with insulation structures may be arranged next to one another, whereby the voltage supply for the several electrodes may be provided by a common supply electrode. At least one output or read-out electrode may be applied to the other major surface of the detector device as well.

According to the invention, the coupling capacitances are integrated into the semiconductor detector, while the voltage supply is through a supply electrode of equal or the same conductivity as, and arranged near, the output or read-out electrode. The integration of the coupling capacitance is achieved in that an insulating layer is arranged in the output electrode between the highly doped part and the metallized part. The fact that electrodes of equal conductivity placed close to one another are only electrically separated from one another at small voltage differnetials is put to effective use in the voltage supply. If the voltage difference between neighboring electrodes exceeds a certain value, then a current flows between the electrodes and increases approximately exponentially with increasing voltage. By these means the voltage at the doped part of the output electrode follows the bias voltage at the supply electrode.

BRIEF DESCRIPTION OF THE DRAWINGS

In order that the invention may be clearly undertood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
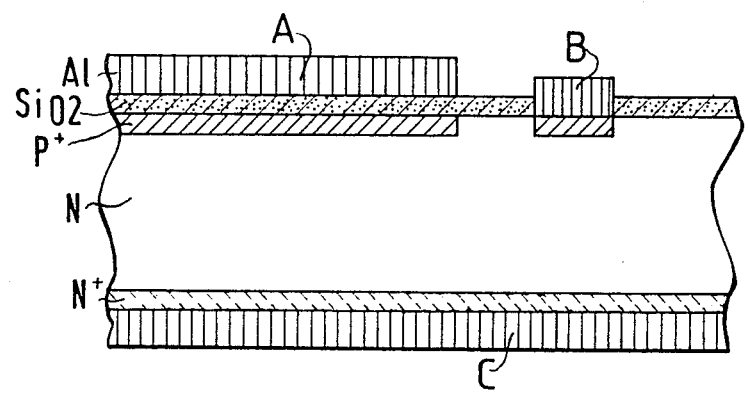
FIG. 1 is a cross-sectional view of a semiconductor detector according to the invention, with read-out of minority charge carriers.
Figure 2:
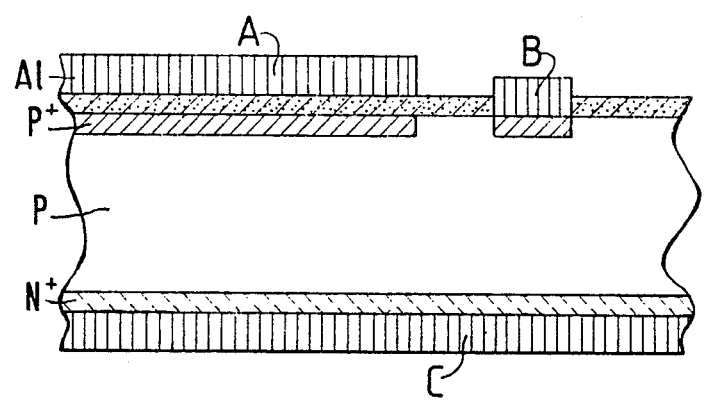
FIG. 2 is a view similar to FIG. 1, but with read-out of majority charge carriers.

If a bias voltage is applied across the semiconductor detector shown in FIG. 1, namely between the voltage supply electrode B and the opposite side C of the detector, then the doped region of the output electrode A will independently attain a potential slightly different from that of the voltage supply electrode B. The potential difference between the electrodes A and B is determined by the electrode spacing and the oxide charge among other things. The detector arrangement of FIG. 2 for the read out of majority charge carriers functions analogously to the detector of FIG. 1, but requires the application of a sufficiently higher bias voltage to completely deplete the detector volume.

Figure 3:
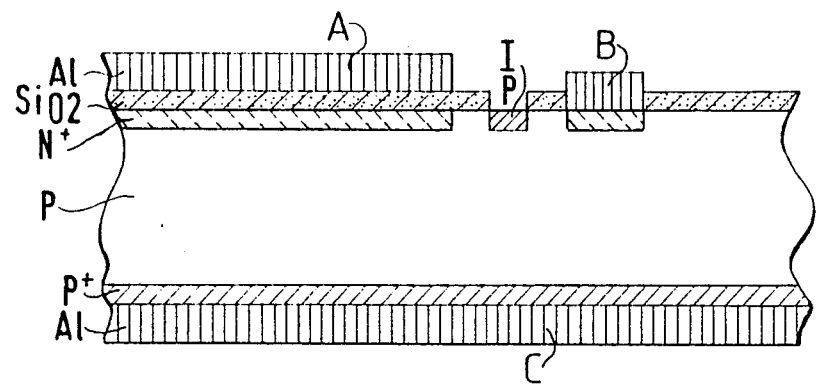
FIG. 3 is a view similar to FIG. 1 of a modified semiconductor detector with an insulating structure.
Figure 4:
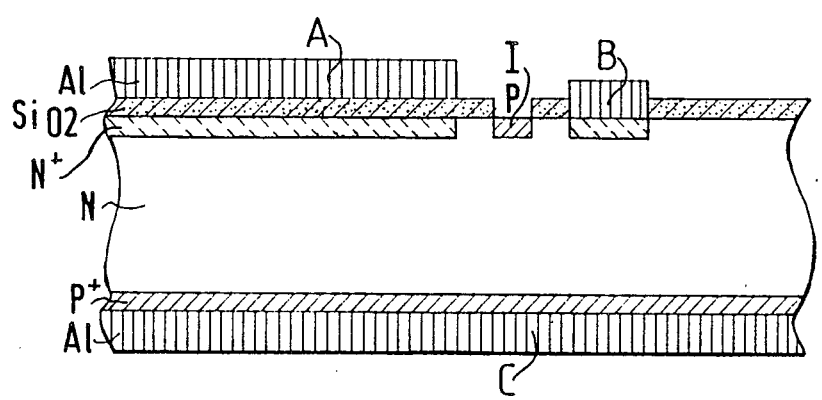
FIG. 4 is a view similar to FIG. 2 of a modified semiconductor detector with an insulating structure.
Figure 5:
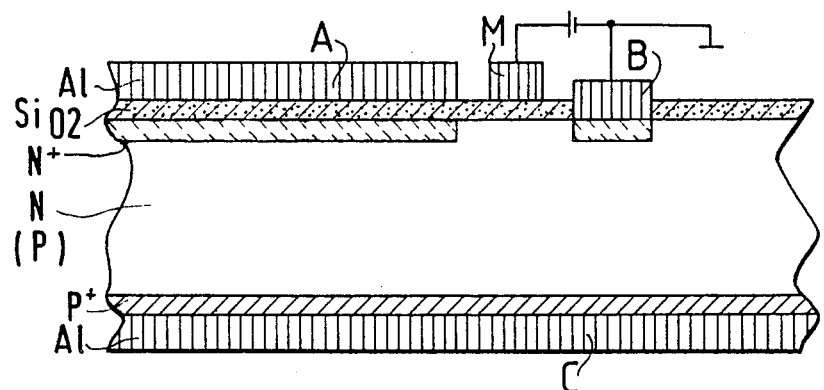
FIG. 5 is a cross-sectional view of another embodiment of a semiconductor detector with read-out of majority charge carriers using an MOS structure for insulation.

A certain complication could arise with the use of N-type material for the majority carrier read out or with the use of P-type material for the minority carrier read out, because the positive oxide charges at the Si-SiO$_2$ boundary create an electrical connection among the output electrodes and between them and the voltage supply electrodes. This problem may, however, be avoided, for example, by arranging appropriate insulating P-type regions I as shown in FIGS. 3 and 4, or appropriately biased MOS structures M as shown in FIG. 5, between neighboring electrodes.

Figure 6:
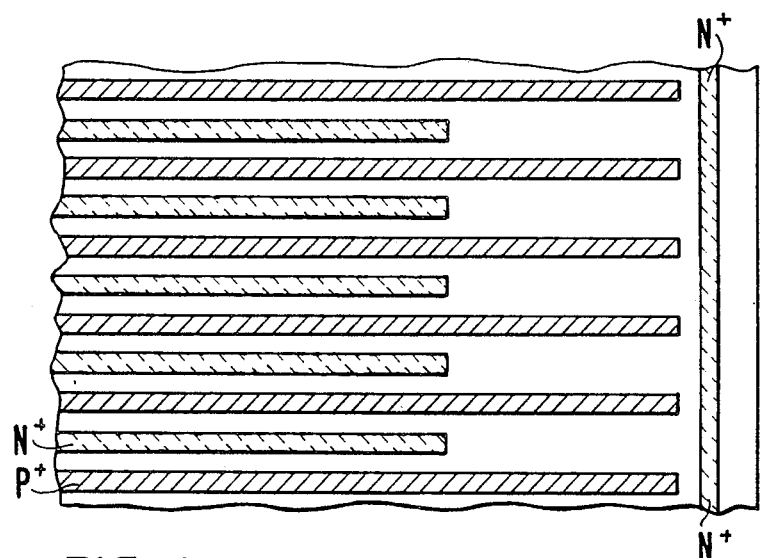
FIG. 6 is a top view of a semiconductor detector with strip-like read-out electrodes interleaved with insulating structures.

Furthermore, as shown in FIG. 6 for strip detector or N-type material with majority carrier read out, it is possible to use the relatively high surface resistance of the electron accumulation or inversion layer to develop a bias resistance. The P strips act as insulation between the N+ output electrodes, whereby the former extend with a greater length beyond the latter so that the long accumulation layer between the P strips forms the bias resistance. The value of the bias resistance may be chosen or varied by varying the width or the shape of the end portions of the insulating strips P.

The example embodiments described above have the main advantage in addition to the integration of coupling capacitances into the detector as already mentioned. Namely, the formation of resistances by additional technological steps, such as fabrication of polysilicon resistors, for example, can be avoided.

Figure 7:
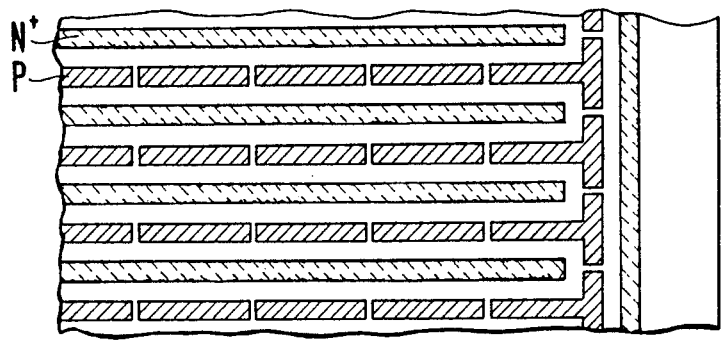
FIG. 7 is a top view of a semiconductor detector with a segmented insulating strip electrode structure.
Figure 8:
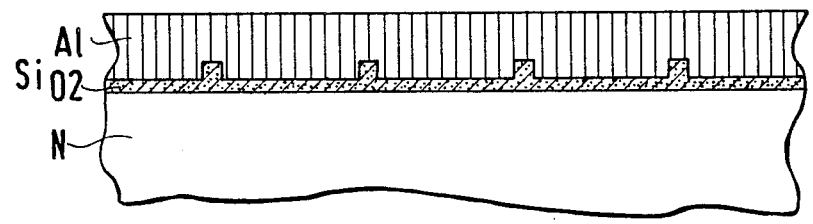
FIG. 8 is a lengthwise sectional view through an insulating MOS strip electrode structure of a semiconductor detector embodiment.

The embodiments shown in FIGS. 7 and 8 are advantageous for inhomogenous doping of the starting base material. As shown, the insulating regions of a different conductivity are segmented. Since the individual or separate segments of the insulation structure can adjust themselves to different voltages, the electrical insulating effect is already achieved at lower voltages, whereby the electric fields are reduced.

Figure 9:
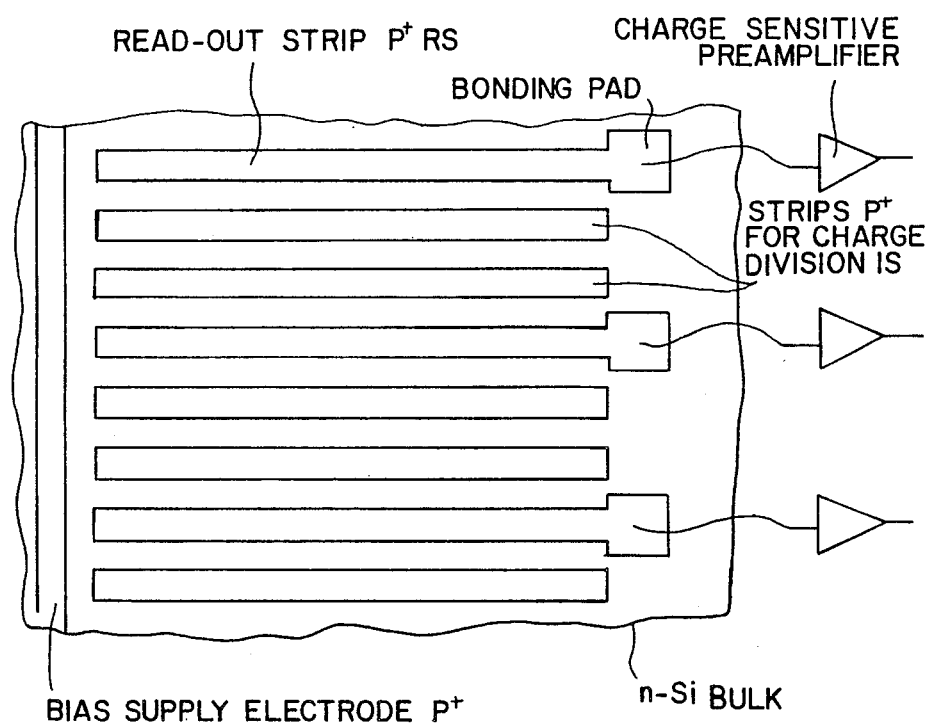
FIG. 9 shows an embodiment of a strip detector with several read-out electrodes interleaved with non-contacted electrodes using capacitive charge division.
Figure 10A:
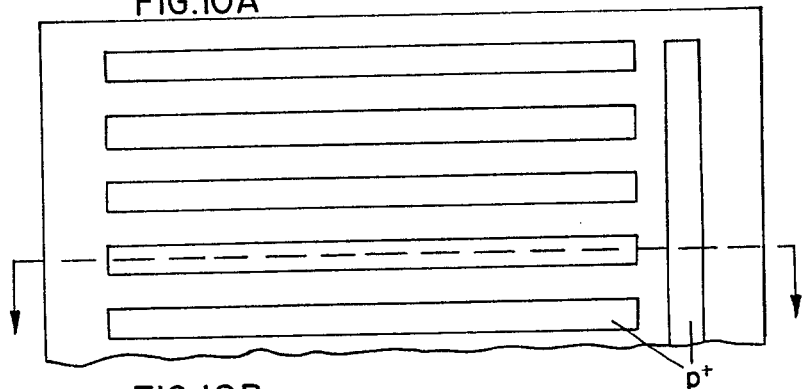
FIGS. 10A to 10D show an embodiment of a double-sided strip detector with integrated coupling capacitors and integrated DC-biasing structures on both sides.
Figure 10B:
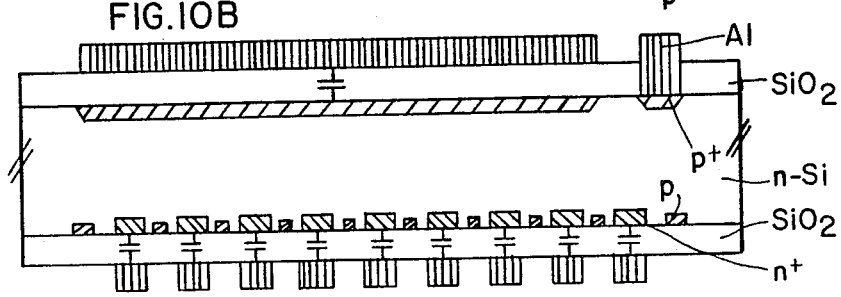
Figure 10C:
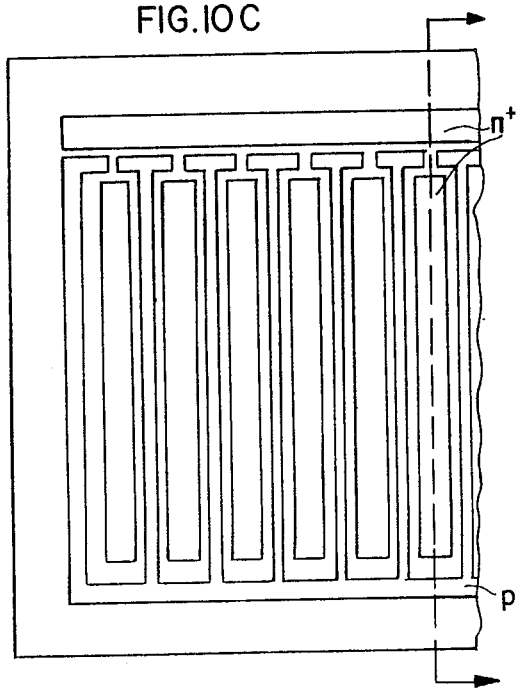
Figure 10D:
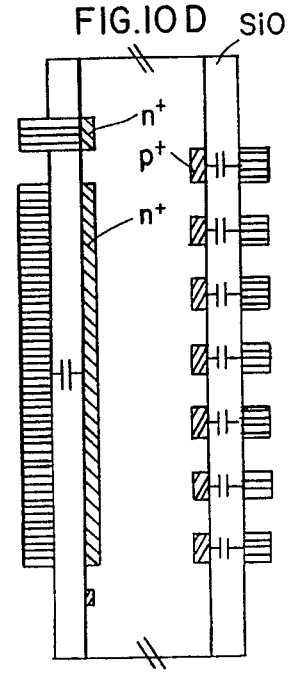

In a further embodiment shown in FIG. 9, several output electrodes are arranged next to one another. Furthermore, several regions having insulating structures may be arranged next to one another with the several electrodes. This embodiment forms a position sensitive detector. If the voltage supply for several output or read-out electrodes is provided by the same common supply electrode, then the detector may be simply tested because several or all output electrodes can simultaneously be supplied with a voltage from a single voltage supply electrode. Furthermore, this embodiment allows a considerable simplification if the read-out is done by means of capacitive charge division. This type of read-out in the form of a strip detector is shown in FIG. 9 and involves connecting electronic circuitry to chosen output or read-out electrodes, generally at a regular spacing. In this connection it is heretofore necessary to set the electrodes from which there is no read-out to the same potential, which is normally achieved in the prior art by means of applying highly resistive resistance layers. Such layers are not necessary in the embodiment of the invention since the doped parts of the read-out strip RS and interpolation strips IS for charge division attain automatically the same voltage.

A further especially interesting embodiment includes at least one output electrode arranged on the other major surface of the detector, whereby both types of charge carriers may be used simultaneously for producing output signals. With a strip-type arrangement of the output electrodes on both major planes of the detector, as shown in FIGS. 10A to 10D a single detector may be used to simultaneously measure two independent coordinates.

Several modifications of the above described embodiments are possible within the scope of the invention. For example, various semiconductor materials, insulators, and conductors may be utilized. Thus, for example, the aluminum shown in the drawings could be replaced by polysilicon, silicon oxide could be replaced by silicon nitride, and bipolar diodes could be replaced by Schottky diodes or hetero junctions. There are also several variations possible in the specific geometry of the structures, namely, for example, a cylindrical geometry, a meander structure, or replacement of the strip stucture by a pad structure. A serial voltage supply for the output electrodes is possible instead of, or in addition to, the parallel supply described in the above example embodiments. When utilizing the electron accumulation layer or the inversion layer, it is possible to vary the value of the bias resistor by changing the width or the configuration of the insulation structure.

Although the invention has been described with reference to specific example embodiments, it will be appreciated, that it is intended to cover all modifications and equivalents within the scope of the appended claims.

What we claim is:

1. A semiconductor detector comprising an at least partially depleted base region having a first conductivity, means for applying a bias voltage to said base region, output or read-out electrode means arranged on at least one major surface of said detector at which an output signal is produced by charge carriers generated by radiation incident on said detector, said output or read-out electrode means comprising a highly doped zone having a second conductivity, an insulating layer applied on said highly doped zone, and a conducting electrode layer applied on said insulating layer. whereby said output signal is readable at said conducting electrode layer, said detector further comprising at least one voltage supply electrode means having said second conductivity and being connected to said highly doped zone in a high impedance manner through said base region of said detector for supplying a voltage to said highly doped zone.

2. The semiconductor detector of claim 1, wherein said second conductivity is the same as said first conductivity.

3. The semiconductor detector of claim 1, further comprising at least one insulating structure at least partially surrounding said read-out or output electrode means for electrically separating said read-out or output electrode means from said supply electrode means, said insulating structure having zones of a conductivity differing from the conductivity of said electrode means.

4. The semiconductor detector of claim 3, wherein said insulating structure comprises at least one MOS structure which at least partially surrounds said read-out or output electrode means.

5. The semiconductor detector of claim 3, wherein said insulating structure for electrically separating said electrodes comprises at least one region in which oxide charges are compensated by means of surface area doping.

6. The semiconductor detector of claim 5, wherein said surface area doping comprises implanted ions.

7. The semiconductor detector of claim 3, wherein said zones of different conductivity are segmented so that separate segments can attain different voltages.

8. The semiconductor detector of claim 4, wherein said biased MOS structure is segmented, creating an inversion layer for each segment which may each attain different voltages.

9. The semiconductor detector of claim 1, wherein said output or read-out electrode means comprise several output electrodes arranged adjacent to one another.

10. The semiconductor detector of claim 3, wherein said output or read-out electrode means comprise several output electrodes, and wherein several insulation structures are arranged adjacent one another with said output electrodes.

11. The semiconductor detector of claim 10, wherein a voltage supply for said several output electrodes is provided by a single voltage supply electrode.

12. The semiconductor detector of claim 1, wherein said read-out or output electrode means comprise at least a second output electrode arranged on a second major surface of said detector.

13. The semiconductor detector of claim 1, wherein said second conductivity is different from said first conductivity.

* * * * *